US012096696B2

(12) United States Patent
Jin

(10) Patent No.: US 12,096,696 B2
(45) Date of Patent: Sep. 17, 2024

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jisong Jin, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 304 days.

(21) Appl. No.: 17/204,120

(22) Filed: Mar. 17, 2021

(65) Prior Publication Data
US 2021/0305500 A1    Sep. 30, 2021

(30) Foreign Application Priority Data
Mar. 30, 2020    (CN) .......................... 202010238875.0

(51) Int. Cl.
H10N 50/80    (2023.01)
G11C 11/16    (2006.01)
H01L 29/82    (2006.01)
H10N 50/01    (2023.01)
H10N 50/10    (2023.01)
H10N 50/85    (2023.01)

(52) U.S. Cl.
CPC ........... *H10N 50/01* (2023.02); *G11C 11/161* (2013.01); *H01L 29/82* (2013.01); *H10N 50/10* (2023.02); *H10N 50/80* (2023.02); *H10N 50/85* (2023.02)

(58) Field of Classification Search
CPC ........ H10N 50/01; H10N 50/10; H10N 50/80; H10N 50/85; G11C 11/161; H01L 29/82; H10B 61/00
See application file for complete search history.

(56) References Cited

U.S. PATENT DOCUMENTS

| | | | | |
|---|---|---|---|---|
| 2010/0001356 A1* | 1/2010 | Kim | ........................ | H10N 50/01 257/E29.323 |
| 2019/0259808 A1* | 8/2019 | Jacob | ..................... | H10N 50/80 |
| 2022/0050150 A1* | 2/2022 | Chien | .................... | H10B 61/20 |

* cited by examiner

Primary Examiner — Meiya Li
(74) Attorney, Agent, or Firm — Anova Law Group, PLLC

(57) ABSTRACT

A semiconductor structure and a fabrication method of the semiconductor structure are provided in the present disclosure. The semiconductor structure includes a base substrate, a bottom electrode layer on the substrate, a magnetic tunnel junction layer on the bottom electrode layer, and a top electrode layer on the magnetic tunnel junction layer. An opening is formed at least exposing a portion of one of an upper surface and a lower surface of the magnetic tunnel junction layer.

14 Claims, 7 Drawing Sheets

SEMICONDUCTOR STRUCTURE AND FABRICATION METHOD THEREOF

CROSS-REFERENCE TO RELATED APPLICATION

This application claims the priority of Chinese Patent Application No. 202010238875.0, filed on Mar. 30, 2020, the content of which is incorporated herein by reference in its entirety.

TECHNICAL FIELD

The present disclosure generally relates to the field of semiconductor manufacturing and, more particularly, relates to a semiconductor structure and its fabrication method.

BACKGROUND

As a new type of non-volatile memory, spin-transfer torque magnetic random-access memory (STT-MRAM), which implements information write through spin current, may combine the high-speed read and write capability of static random-access memory (SRAM) and the high integration of dynamic random-access memory (DRAM). The STT-MRAM may perform erase and write operations for unlimited times without refreshing, and have advantages of long lifetime, low power consumption, and radiation resistance, such that it is considered to be an ideal device for manufacturing next-generation non-volatile cache and main memory.

The core structure of the STT-MRAM memory cell is a magnetic tunnel junction composed of a fixed layer, a barrier layer, and a free layer. The magnetization direction of the fixed layer may be fixed and compared with the magnetization direction of the free layer, and the magnetization direction of the free layer may be changed. When performing write operations to the STT-MRAM, the magnetization direction of the free layer may be changed to be in parallel with the magnetization direction of the fixed layer (logic "0" state), and the magnetic tunnel junction is in a low resistance state; or the magnetization direction of the free layer may be changed to be in anti-parallel with the magnetization direction of the fixed layer (logic "1" state), and the magnetic tunnel junction is in a high resistance state, thereby achieving two memory states. In a "read" process, the state of the STT-MRAM may be read by comparing the resistance of the magnetic tunnel junction cell with the resistance of a standard cell.

However, the performance of the STT-MRAM in the existing technology still needs to be improved.

SUMMARY

One aspect of the present disclosure provides a semiconductor structure. The semiconductor structure includes a base substrate; a bottom electrode layer on the substrate; a magnetic tunnel junction layer on the bottom electrode layer; and a top electrode layer on the magnetic tunnel junction layer, wherein openings are formed at least exposing a portion of one of an upper surface and a lower surface of the magnetic tunnel junction layer.

Optionally, the openings include first type openings or second type openings; a first type opening extends from a sidewall of at least one of the top electrode layer and the bottom electrode layer to a middle of the at least one of the top electrode layer and the bottom electrode layer along a direction in parallel with a surface of the substrate; and a second type opening passes through the at least one of the top electrode layer and the bottom electrode layer along a direction perpendicular to the surface of the substrate.

Optionally, the openings expose the portion of the upper surface of the magnetic tunnel junction layer.

Optionally, the openings expose the portion of the lower surface of the magnetic tunnel junction layer.

Optionally, the openings expose the portion of the upper surface of the magnetic tunnel junction layer and the portion of the lower surface of the magnetic tunnel junction layer.

Optionally, the top electrode layer is a single-layer or multiple-layer structure; and a bottom electrode layer is a single-layer or multiple-layer structure.

Optionally, the magnetic tunnel junction layer includes a fixed layer on the bottom electrode layer, a barrier layer on the fixed layer, and a free layer on the barrier layer.

Optionally, the fixed layer is made of a material including Co, Fe, Ru, B, Pt, Ta, Ni, Ta, Cr, an alloy material including at least one of Co, Fe, Ru, B, Pt, Ta, Ni, Ta, and Cr, or a combination thereof; the barrier layer is made of a material including $Al_2O_3$, MgO, or a combination thereof; and the free layer is made of a material including Co, Fe, Ru, B, an alloy material including at least one of Co, Fe, Ru, and B, or a combination thereof.

Optionally, the magnetic tunnel junction layer further includes a protective layer on the free layer; and the protective layer is made of a material including magnesium oxide, aluminum oxide, or a combination thereof.

Optionally, the structure further includes a first metal layer in the substrate, wherein a top surface of the first metal layer is coplanar with a top surface of the substrate.

Another aspect of the present disclosure provides a method for fabricating a semiconductor structure. The method includes providing a substrate; forming a bottom electrode material layer on the substrate; forming a magnetic tunnel junction material layer on the bottom electrode material layer; forming a top electrode material layer on the magnetic tunnel junction material layer; sequentially etching the top electrode material layer, the magnetic tunnel junction material layer, and the bottom electrode material layer till a surface of the substrate is exposed, thereby forming a top electrode layer, a magnetic tunnel junction layer, and a bottom electrode layer; and at least etching sidewalls of one of the top electrode layer and the bottom electrode layer to form openings, wherein the openings expose a portion of a surface of the magnetic tunnel junction layer.

Optionally, the openings include first type openings or second type openings; a first type opening extends from a sidewall of at least one of the top electrode layer and the bottom electrode layer to a middle of the at least one of the top electrode layer and the bottom electrode layer along a direction in parallel with the surface of the substrate; and a second type opening passes through the at least one of the top electrode layer and the bottom electrode layer along a direction perpendicular to the surface of the substrate.

Optionally, the method further includes, after forming the top electrode layer, the magnetic tunnel junction layer, and the bottom electrode layer, etching the sidewalls of the top electrode layer to form the openings.

Optionally, the method further includes, after forming the top electrode layer, the magnetic tunnel junction layer, and the bottom electrode layer, etching the sidewalls of the bottom electrode layer to form the openings.

Optionally, the method further includes, after forming the top electrode layer, the magnetic tunnel junction layer, and the bottom electrode layer, etching the sidewalls of the top electrode layer and the bottom electrode layer to form the openings.

Optionally, the method further includes etching the top electrode material layer till exposing a surface of the magnetic tunnel junction material layer to form the top electrode layer; etching the sidewalls of the top electrode layer to form the openings; etching the magnetic tunnel junction material layer till exposing a surface of the bottom electrode material layer to form the magnetic tunnel junction layer; and etching the bottom electrode material layer till exposing the surface of the substrate to form the bottom electrode layer.

Optionally, the method further includes, after forming the bottom electrode layer, etching the sidewalls of the bottom electrode layer to form the openings.

Optionally, the sidewalls of at least one of the top electrode layer and the bottom electrode layer are etched by a process including a wet etching process, a dry etching process, or a combination thereof.

Optionally, the method further includes, before forming the bottom electrode material layer, forming a plurality of discrete first metal layers in the substrate, wherein a top surface of the plurality of first metal layers is coplanar with a top surface of the substrate.

Compared with the existing technology, the technical solutions provided by the present disclosure may achieve at least the following beneficial effects.

The semiconductor structure provided by the embodiments of the present disclosure may have the openings which expose at least a portion of one of the upper surface and the lower surface of the magnetic tunnel junction layer. The openings may enable the magnetic tunnel junction layer to be not coplanar with the edges of at least one of the bottom electrode layer and the top electrode layer along a vertical direction. When the current flows from the bottom electrode layer to the magnetic tunnel junction layer, the current may need to flow through the surface of the magnetic tunnel junction layer exposed by the openings and may be avoided to directly flow through the coplanar edges, which may increase the current flow path and the resistance of at least one of the bottom electrode layer and the top electrode layer, thereby reducing the leakage current. It is advantageous for increasing the resistance value difference of the magnetic tunnel junction layer under different memory states and improving the performance of the semiconductor structure, thereby improving the memory state reliability of the memory including the magnetic tunnel junction layer.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A semiconductor structure and a fabrication method of the semiconductor structure are provided in the present disclosure. The semiconductor structure includes a base substrate, a bottom electrode layer on the substrate, a magnetic tunnel junction layer on the bottom electrode layer, and a top electrode layer on the magnetic tunnel junction layer. An opening is formed at least exposing a portion of one of an upper surface and a lower surface of the magnetic tunnel junction layer.

Figure 1:
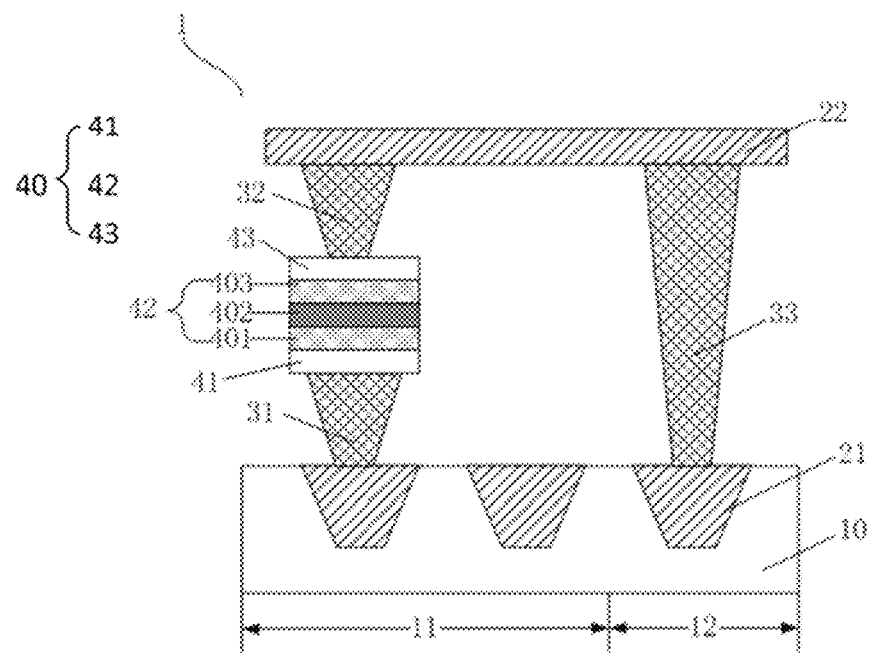
FIG. 1 illustrates a structural schematic of an exemplary semiconductor structure.

FIG. 1 illustrates a structural schematic of an STT-MRAM. The STT-MRAM may be divided into two portions including a memory cell region 11 and a peripheral drive circuit region 12.

Referring to FIG. 1, a semiconductor structure 1 may include:

a substrate 10 including a first metal layer 21, a magnetic tunnel junction unit 40, and a second metal layer 22, where the first metal layer 21 is electrically connected to the magnetic tunnel junction unit 40 through a first via hole 31; the magnetic tunnel junction unit 40 includes a bottom electrode layer 41, a magnetic tunnel junction unit main body layer 42, and a top electrode layer 43; and the magnetic tunnel junction unit 40 is electrically connected to the second metal layer 22 of the memory cell region 11 through a second via hole 32. The first metal layer 21 of the peripheral drive circuit region 12 and the second metal layer 22 of the peripheral drive circuit region 12 may be electrically connected with each other through a third via hole 33.

The magnetic tunnel junction unit main body layer 42 may include a fixed layer 401 on the surface of the bottom electrode layer 41, a barrier layer 402 on the surface of the fixed layer 401, and a free layer 403 on the surface of the barrier layer 402.

During the read process of the STT-MRAM, a current may pass through the bottom electrode layer 41, the magnetic tunnel junction unit main body layer 42, and the top electrode layer 43; by changing the magnetization direction of the free layer 403, it is determined whether the resistance of the magnetic tunnel junction unit main body layer 42 is large or small, thereby determining whether the memory state is "0" or "1".

However, as shown in FIG. 1, the magnetic tunnel junction unit main body layer 42 is coplanar with the edges of the bottom electrode layer 41 and the top electrode layer 43 along the direction perpendicular to each layer. In a current write and read process, most of a current may flow from opposite sides along the vertical direction, causing the leakage current of the magnetic tunnel junction unit main body layer 42 to be large. As a result, the resistance value difference of the magnetic tunnel junction unit main body layer 42 of the STT-MRAM in different memory states is small, which may cause the memory state of the memory to be inaccurate and adversely affect the performance of the STT-MRAM.

In order to solve the above-mentioned technical problem, the embodiments of the present disclosure provide a semiconductor structure. The semiconductor structure may have openings which expose at least a portion of one of the upper surface and the lower surface of the magnetic tunnel junction layer. The openings may enable the magnetic tunnel junction layer to be not coplanar with the edges of at least one of the bottom electrode layer and the top electrode layer along a vertical direction. When a current flows from the bottom electrode layer to the magnetic tunnel junction layer, or when the current flows from the magnetic tunnel junction layer to the top electrode layer, the current may not flow directly along the coplanar edges and need to flow through the surface of the magnetic tunnel junction layer exposed by the openings, which may increase the current flow path and the resistance of at least one of the bottom electrode layer and the top electrode layer, thereby reducing the leakage current. It is advantageous for increasing the resistance value difference of the magnetic tunnel junction layer under different memory states and improving the performance of the semiconductor structure, thereby improving the memory state reliability of the memory including the magnetic tunnel junction layer.

In order to clearly illustrate the above-mentioned objectives, features, and advantages of the present disclosure, various embodiments of the present disclosure are described in detail with reference to the accompanying drawings hereinafter.

Figure 2:
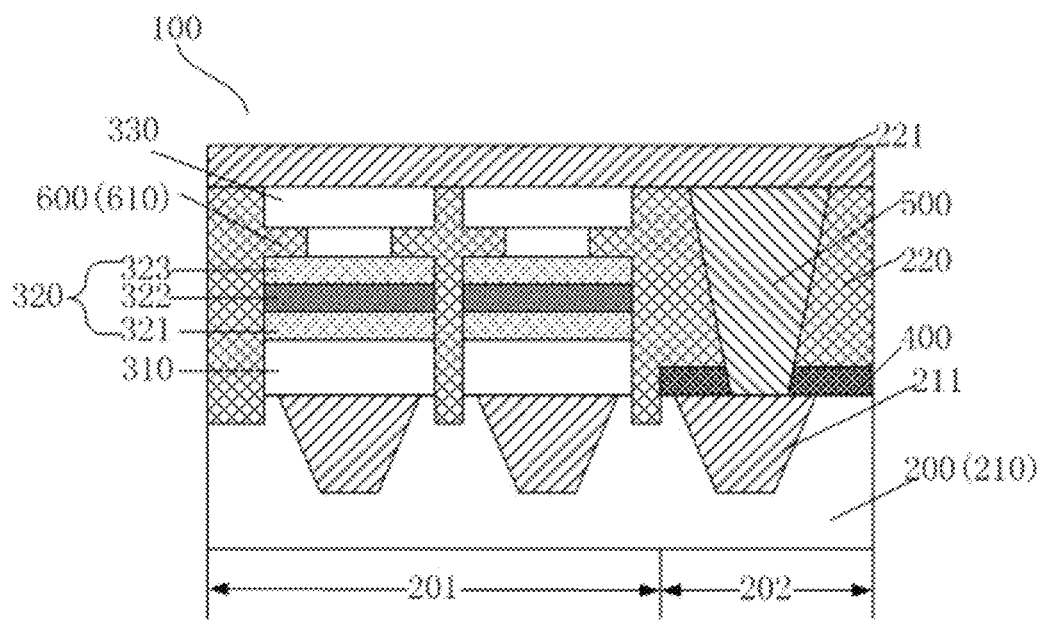
FIG. 2 illustrates a structural schematic of a semiconductor structure according to various disclosed embodiments of the present disclosure.
Figure 3:
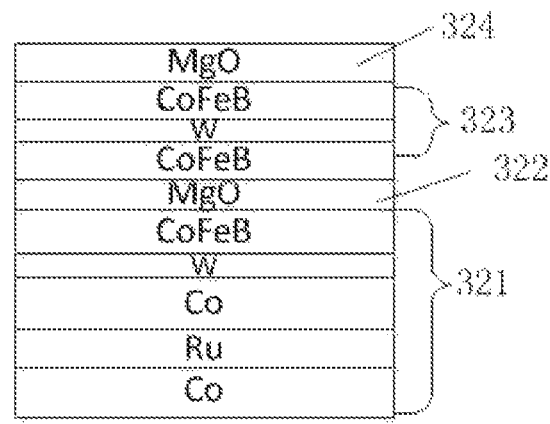
FIG. 3 illustrates a structural schematic of a magnetic tunnel junction layer according to various disclosed embodiments of the present disclosure.
Figure 4:
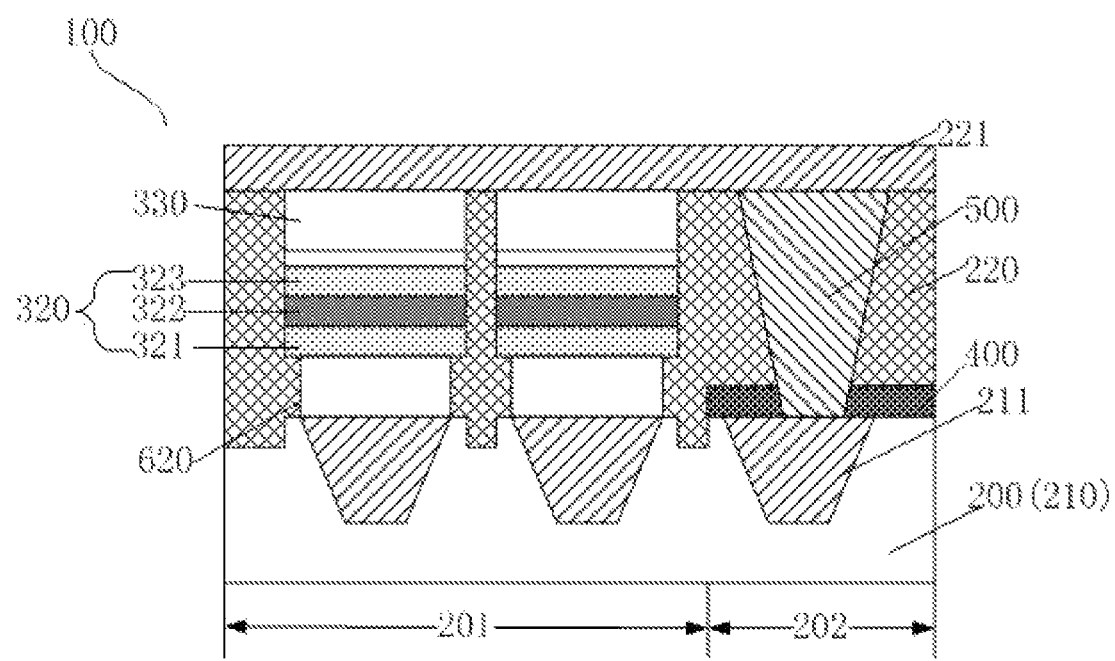
FIG. 4 illustrates a structural schematic of another semiconductor structure according to various disclosed embodiments of the present disclosure.
Figure 5:
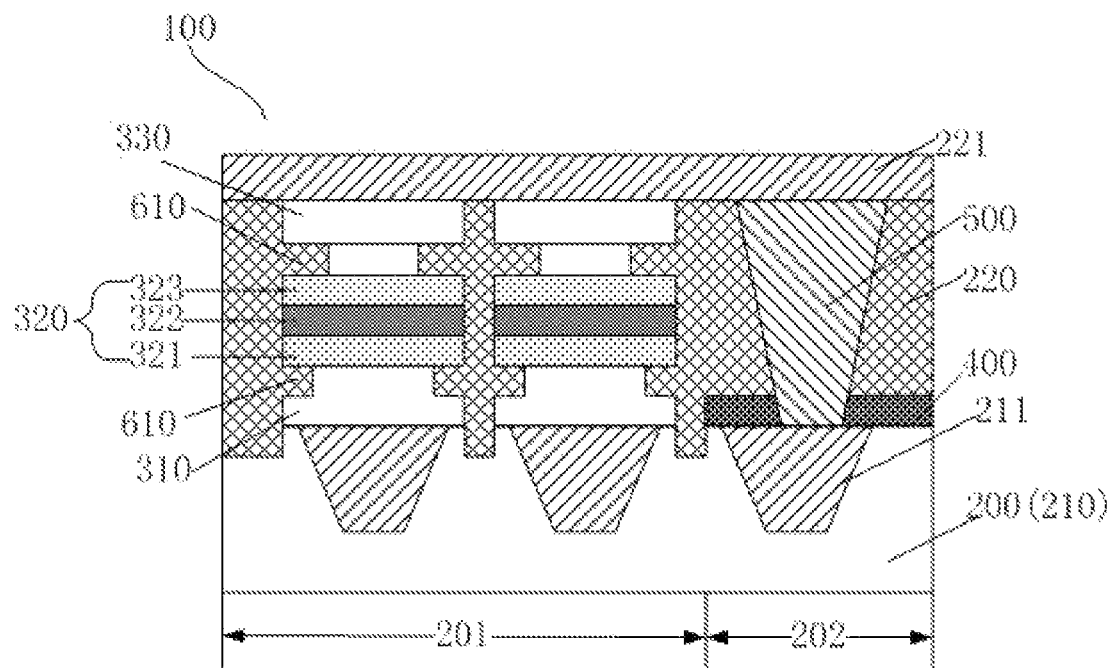
FIG. 5 illustrates a structural schematic of another semiconductor structure according to various disclosed embodiments of the present disclosure.

FIG. 2 illustrates a structural schematic of a semiconductor structure according to various disclosed embodiments of the present disclosure; FIG. 3 illustrates a structural schematic of a magnetic tunnel junction layer according to various disclosed embodiments of the present disclosure; FIG. 4 illustrates a structural schematic of another semiconductor structure according to various disclosed embodiments of the present disclosure; and FIG. 5 illustrates a structural schematic of another semiconductor structure according to various disclosed embodiments of the present disclosure.

Referring to FIG. 2, a semiconductor structure 100 may include a base substrate 200.

The base substrate 200 may be divided into a memory cell region 201 and a peripheral drive circuit region 202.

In one embodiment, the base substrate 200 may include a substrate (not shown) and a first dielectric layer 210 on the substrate. The substrate may be selected from an N-type silicon substrate, a P-type silicon substrate, a silicon on insulator (SOI) substrate, and the like. The substrate may also include a transistor which may be used as a switch in the memory to control the working state of the magnetic tunnel junction and the current in the circuit. The first dielectric layer 210 may be selected from one or more materials of silicon dioxide, borosilicate glass, borophosphosilicate glass, tetraethyl orthosilicate, and/or any other suitable material(s).

In one embodiment, a first metal layer 211 may also be in the first dielectric layer 210; and the top surface of the first metal layer 211 may be coplanar with the top surface of the first dielectric layer 210. The material of the first metal layer 211 may be selected from metal materials of copper, cobalt, tungsten, platinum, and/or any other suitable material(s).

In one embodiment, the first metal layer 211 may be electrically connected to the transistor in the substrate through a conductive plug (not shown).

Referring to FIG. 2, the semiconductor structure 100 may further include a bottom electrode layer 310 on the base substrate 200, a magnetic tunnel junction layer 320 on the bottom electrode layer 310, and a top electrode layer 330 on the magnetic tunnel junction layer 320.

The material of the bottom electrode layer 310 may be any one or a combination of Ta, Pt, Co, Fe, Ru, Al, W, Ti, TiN, TaN, Ni, NiFe, and any other suitable material(s). The material of the top electrode layer 330 may be any one or a combination of Ta, Pt, Co, Fe, Ru, Al, W, Ti, TiN, TaN, Ni, NiFe, and any other suitable material(s).

The bottom electrode layer 310 may be a single-layer or multiple-layer structure, and the top electrode layer 330 may be a single-layer or multiple-layer structure.

In one embodiment, the bottom electrode layer 310 may be a single-layer structure, and the material of the bottom electrode layer 310 may be Ta; the top electrode layer 330, a double-layer structure, may include a TiN layer on the surface of the magnetic tunnel junction layer 320 and a Ta layer on the surface of the TiN layer.

In one embodiment, the thickness range of the TiN layer may be from 20 Å to 500 Å. The resistance ratio of the TiN layer over the top electrode layer 330 may be relatively small, and the thickness of the TiN layer may be relatively thin, which may reduce the influence on the resistance of the entire magnetic tunnel junction layer, the top electrode layer, and the bottom electrode layer.

Referring to FIG. 2, in one embodiment, the magnetic tunnel junction layer 320 may be a three-layer structure, including a fixed layer 321 on the surface of the bottom electrode layer 310, a barrier layer 322 on the surface of the fixed layer 321, and a free layer 323 on the surface of the barrier layer 322.

The fixed layer 321 may be made of a material including Co, Fe, Ru, B, Pt, Ta, Ni, Cr, a Co-containing alloy material, a Ru-containing alloy material, a Fe-containing alloy material, a B-containing alloy material, a Pt alloy material, a Ta-containing alloy material, a Ni-containing alloy material, a Cr-containing alloy material, and/or any other suitable material(s). The barrier layer 322 may be made of a material including $Al_2O_3$ or MgO. The free layer may be made of a material including Co, Fe, Ru, B, a Co-containing alloy material, a Ru-containing alloy material, a Fe-containing alloy material, a B-containing alloy material, and/or any other suitable material(s).

In one embodiment, the material of the fixed layer 321 may be CoFeB; the material of the barrier layer 322 may be MgO; and the material of the free layer 323 may be CoFeB.

In other embodiments, the fixed layer 321 may also be a multiple-layer structure. The fixed layer 321 may be the multiple-layer structure including at least one of above-mentioned materials (Co, Fe, Ru, B, Pt, Ta, Ni, Cr, a Co-containing alloy material, a Ru-containing alloy material, a Fe-containing alloy material, a B-containing alloy material, a Pt alloy material, a Ta-containing alloy material, a Ni-containing alloy material, or a Cr-containing alloy material). The free layer 323 may also be a multiple-layer structure. The free layer 323 may be the multiple-layer structure including at least one of above-mentioned materials (Co, Fe, Ru, B, a Co-containing alloy material, a Ru-containing alloy material, a Fe-containing alloy material, or a B-containing alloy material).

In other embodiments, the magnetic tunnel junction layer 320 may further include a protective layer 324 on the free layer 323; and the material of the protective layer 324 may include magnesium oxide or aluminum oxide.

FIG. 3 illustrates a structural schematic of the magnetic tunnel junction layer 320 according to various disclosed embodiments of the present disclosure. Referring to FIG. 3, the fixed layer 321 may include a Co layer, a Ru layer, a Co layer, a CoFeB layer, and a coupling layer W layer located between the Co layer and the CoFeB layer, which are sequentially stacked; the material of the barrier layer 322 may be MgO; the free layer 323 may include a pair of CoFeB layers and a coupling layer W layer between the CoFeB layers; and the protective layer 324 may be MgO. When the protective layer interface of the free layer 323 is formed of MgO, the top and bottom of the free layer 323 may both be in contact with the MgO film, the top and bottom of the free layer 323 may both obtain the interface magnetic anisotropy to double the spin torque.

In other embodiments, the magnetic tunnel junction layer 320 may also be a multiple-layer structure formed by the fixed layer, the barrier layer and the free layer which are alternately stacked.

In one embodiment, the bottom electrode layer 310 may be located on the surface of the first metal layer 211 at the memory cell region 201; and the bottom electrode layer 310 may be electrically connected to the first metal layer 211 at the memory cell region 201.

The bottom electrode layer 310 may be electrically connected to the first metal layer 211 at the memory cell region 201 directly, instead of being electrically connected by via holes. On the one hand, the process steps for forming the semiconductor structure 100 may be reduced to simplify the process flow; and on the other hand, the semiconductor structure 100 may be compatible with existing logic processes, and the memory including the semiconductor structure 100 may be used as an embedded memory.

The bottom electrode layer 310 may be connected to the transistor in the substrate through the electrical connection to the first metal layer 211 at the memory cell region 201, and the working state of the magnetic tunnel junction layer 320 and the current in the circuit may be controlled through the transistor.

In one embodiment, the semiconductor structure 100 may further include an etching stop layer 400. The etching stop layer 400 may be located on the surface of the first metal layer 211 and the first dielectric layer 210 at the peripheral drive circuit region 202.

The etching stop layer 400 may cover the base substrate 200 at the peripheral drive circuit region 202 to avoid the formation of the magnetic tunnel junction layer at the peripheral drive circuit region 202.

The material of the etching stop layer 400 may include silicon nitride or silicon carbide. In one embodiment, the material of the etching stop layer 400 may be nitrogen-doped silicon carbide.

Referring to FIG. 2, the semiconductor structure 100 may further include a second dielectric layer 220. The second dielectric layer 220 may be on the surface of the base substrate 200, the sidewalls and surfaces of the top electrode layer 330, the magnetic tunnel junction layer 320, and the bottom electrode layer 310, and the surface of the etching stop layer 400.

The material of the second dielectric layer 220 may include carbon-doped silicon oxide, or low-temperature silicon oxide or low-temperature tetraethyl orthosilicate prepared based on $SiH_4$. In one embodiment, the material of the second dielectric layer 220 may be carbon-doped silicon oxide.

Referring to FIG. 2, the semiconductor structure 100 may further include a second metal layer 221. The second metal layer 221 may be located in the second dielectric layer 220 and electrically connected to the top electrode layer 330.

In one embodiment, the second metal layer 221, located on the surface of the top electrode layer 330, may be in direct contact with the top electrode layer 330. Via holes may not be used to electrically connect the second metal layer 221 with the top electrode layer 330. On the one hand, the process steps for forming the semiconductor structure 100 may be reduced to simplify the process flow; and on the other hand, the semiconductor structure 100 may be compatible with existing logic processes, the memory including the semiconductor structure 100 may be used as an embedded memory, and the size of the semiconductor structure may be reduced.

In one embodiment, the semiconductor structure 100 may further include a via hole 500 which is located in the second dielectric layer 220. The second metal layer 221 may be electrically connected to the first metal layer 211 at the peripheral drive circuit region 202 through the via hole 500.

Referring to FIG. 2, the semiconductor structure 100 may further include openings 600 which at least expose a portion of one of the upper surface and the lower surface of the magnetic tunnel junction layer 320.

Sidewalls of at least one of the top electrode layer 330 and the bottom electrode layer 310 may have the openings 600. When the openings 600 are disposed on the sidewalls of the top electrode layer 330, the openings 600 may expose a portion of the upper surface of the magnetic tunnel junction layer 320 (i.e., the surface where the magnetic tunnel junction layer 320 and the top electrode layer 330 are attached). When the openings 600 are disposed on the sidewalls of the bottom electrode layer 310, the openings 600 may expose a portion of the lower surface of the magnetic tunnel junction layer 320 (i.e., the surface where the magnetic tunnel junction layer 320 and the bottom electrode layer 310 are attached). When the openings 600 are disposed on the sidewalls of both the top electrode layer 330 and the bottom electrode layer 310, the openings 600 may expose a portion of the upper surface of the magnetic tunnel junction layer 320 and expose a portion of the lower surface of the magnetic tunnel junction layer 320.

In one embodiment, the magnetic tunnel junction layer 320 may not be coplanar with the edges of at least one of the top electrode layer 330 and the bottom electrode layer 310 along a vertical direction by disposing the openings 600. The current needs to flow through the surface of the magnetic tunnel junction layer 320 exposed from the openings 600, which may increase the current flow path and the resistance of at least one of the top electrode layer 330 and the bottom electrode layer 310, thereby avoiding excessive leakage current caused by directly flowing from the coplanar edges. Therefore, the resistance value difference of the magnetic tunnel junction layer 320 under different memory states may be improved, which improves the performance of the semiconductor structure.

The openings 600 may include first type openings or second type openings. The first type openings may extend from the sidewalls of at least one of the top electrode layer and the bottom electrode layer to the middle along a direction in parallel with the surface of the substrate; and the second type openings may pass through at least one of the top electrode layer and the bottom electrode layer along a direction perpendicular to the surface of the substrate.

Referring to FIG. 2, in one embodiment, the openings may expose a portion of the upper surface of the magnetic tunnel junction layer 320. The sidewalls of the top electrode layer 330 may have first type openings 610, and the first type openings 610 may be symmetrically disposed on the sidewalls on two sides of the top electrode layer 330. The first type openings 610 may extend from the sidewalls on one side of the top electrode layer 330 to the middle along the direction in parallel with the surface of the base substrate 200, and two symmetrically disposed first type openings 610 may not completely pass through the width portion of the top electrode layer 330 along the direction in parallel with the surface of the base substrate 200.

In one embodiment, the top electrode layer 330 may be a double-layer structure. The thickness of the first type opening 610 along the direction perpendicular to the surface of the base substrate 200 may be equal to the thickness of the TiN layer in the top electrode layer 330.

Referring to FIG. 4, in another embodiment, the openings may expose a portion of the lower surface of the magnetic tunnel junction layer 320, and the sidewalls of the bottom electrode layer 310 may have second type openings 620. The second type openings 620 may be symmetrically disposed on the sidewalls on two sides of the bottom electrode layer 310. The second type openings 620 may pass through the bottom electrode layer 310 along the direction perpendicular to the surface of the base substrate 200. The height of the second type opening 620 along the direction perpendicular to the surface of the base substrate 200 may be equal to the thickness of the bottom electrode layer 310. The sidewall on one side of the second type opening 620 may coincide with the sidewall on the side of the bottom electrode layer 310.

Referring to FIG. 5, in another embodiment, the sidewalls of the top electrode layer 330 may have the first type openings 610, and the sidewalls of the bottom electrode layer 310 may also have the first type openings 610. The openings may expose a portion of the upper surface of the magnetic tunnel junction layer 320, and also expose a portion of the lower surface of the magnetic tunnel junction layer 320.

In other embodiments, it is also possible that the sidewalls of the top electrode layer 330 may have the second type openings 620, and the sidewalls of the bottom electrode layer 310 may not have openings; or the sidewalls of the bottom electrode layer 310 may have the first type openings 610, and the sidewalls of the top electrode layer 330 may not have openings; or the sidewalls of the top electrode layer 330 may have the first type openings 610, and the sidewalls of the bottom electrode layer 310 may have the second type openings 620, and the like, which may not be described in detail herein.

Correspondingly, the embodiments of the present disclosure also provide a fabrication method for forming the above-mentioned semiconductor structure 100. It should be noted that the material of each structure in the fabrication method may be same as the material of each corresponding structure in the semiconductor structure 100, which may not be described in the fabrication method in detail.

FIGS. 6-12 illustrate structural schematics corresponding to certain stages of a method for forming an exemplary semiconductor structure according to various disclosed embodiments of the present disclosure.

Figure 6:
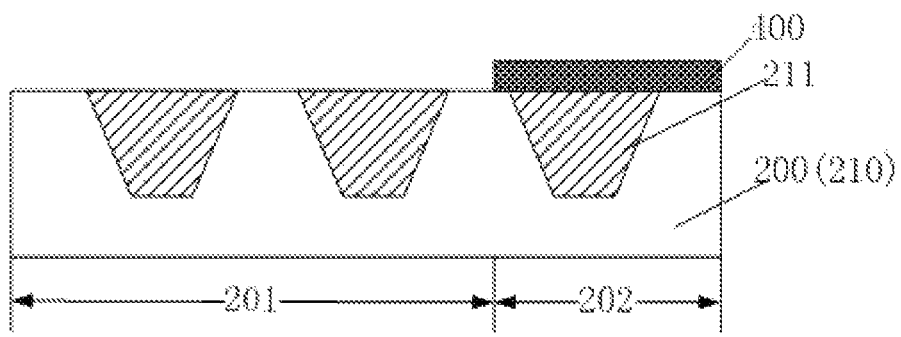
FIGS. 6-12 illustrate structural schematics corresponding to certain stages of a method for forming an exemplary semiconductor structure according to various disclosed embodiments of the present disclosure.
Figure 13:
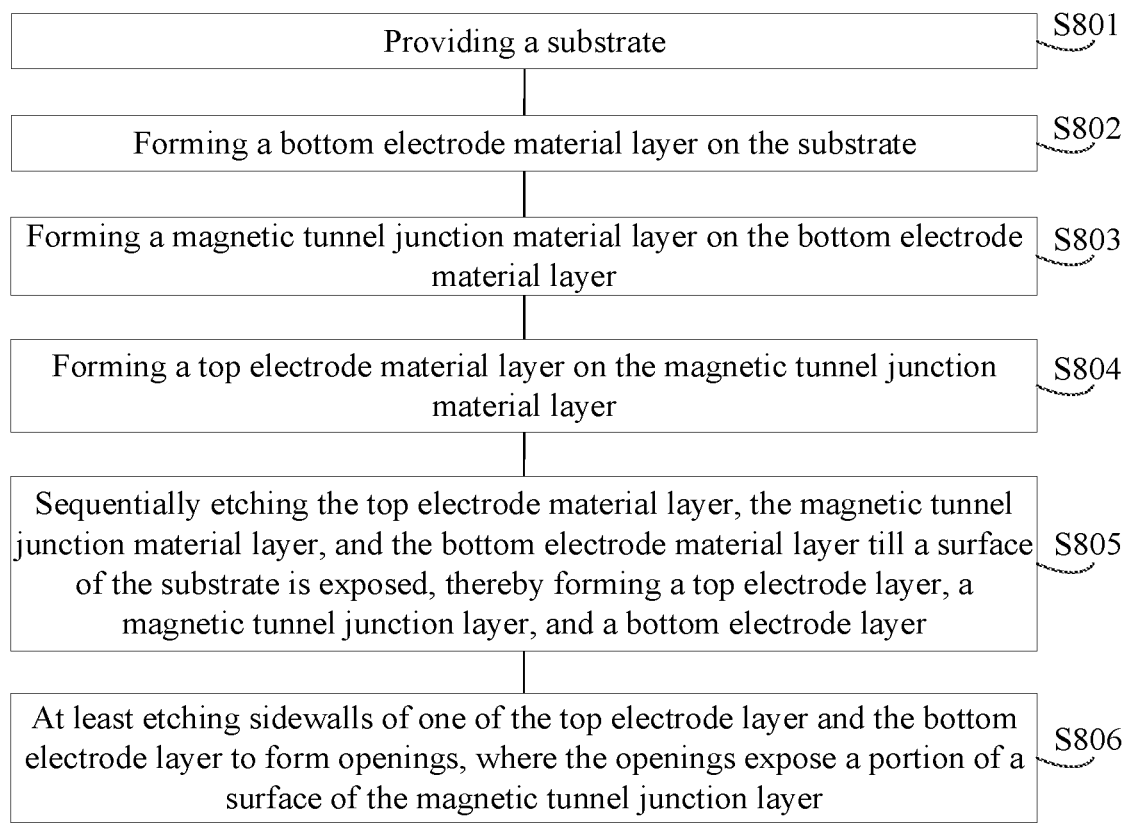
FIG. 13 illustrates a flowchart of an exemplary fabrication method for forming a semiconductor structure according to various disclosed embodiments of the present disclosure.

Referring to FIG. 6, the base substrate 200, which is divided into the memory cell region 201 and the peripheral drive circuit region 202, may be provided (e.g., in S801 of FIG. 13).

The base substrate 200 may include a substrate (not shown) and the first dielectric layer 210 on the substrate. The substrate may also include a transistor which may be used as a switch in the memory to control the working state of the magnetic tunnel junction and the current in the circuit.

Referring to FIG. 6, the first metal layer 211 may be formed in the first dielectric layer 210, and the top surface of the first metal layer 211 may be coplanar with the top surface of the first dielectric layer 210.

In one embodiment, forming the first metal layer 211 may include forming a plurality of trenches arranged in parallel in the first dielectric layer 210 using photolithography and etching processes; and filling the trenches with a metal material to form the first metal layer 211.

Referring to FIG. 6, the etching stop layer 400 may be formed on the first dielectric layer 210 and the first metal layer 211 at the peripheral drive circuit region 202.

In one embodiment, forming the etching stop layer 400 may include forming an etching stop material layer (not shown) on the first dielectric layer 210; forming a patterned photoresist layer (not shown) on the etching step material layer, where the patterned photoresist layer exposes the etching stop material layer located at the memory cell region 201; and using the patterned photoresist layer as a mask, etching the etching stop material layer to form the etching stop layer 400.

The function of the etching stop layer 400 may be used to avoid the damage to the first dielectric layer 210 and the first metal layer 211 at the peripheral drive circuit region 202 when subsequently etching the top electrode material layer, the magnetic tunnel junction material layer, and the bottom electrode material layer.

Figure 7:
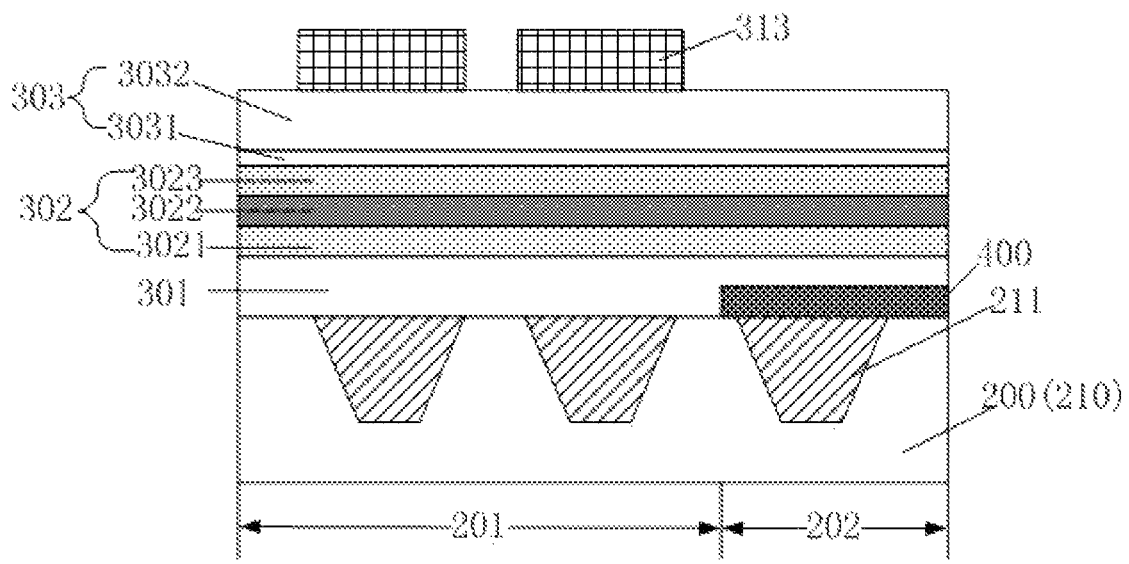

Referring to FIG. 7, a bottom electrode material layer 301 may be formed on the surfaces of the first dielectric layer 210, the first metal layer 211, and the etching stop layer 400 (e.g., in S802 of FIG. 13).

In one embodiment, the bottom electrode material layer 301 may be directly formed on the surface of the first metal layer 211, and the bottom electrode material layer 301 may be subsequently etched to form the bottom electrode layer which is in direct electrical contact with the first metal layer 211, such that there is no need to add an additional mask to form a via hole connecting the first metal layer and the bottom electrode layer, which may reduce the process steps in the semiconductor fabrication process and may be compatible with the existing logic processes.

The bottom electrode material layer 301 may be formed by a physical vapor deposition process or a chemical vapor deposition process. After forming the bottom electrode material layer 301, a chemical mechanical polishing process may also be performed on the bottom electrode material layer 301.

Performing the chemical mechanical polishing may be advantageous for the formation of a smooth interface between the bottom electrode material layer 301 and a magnetic tunnel junction material layer 302 subsequently formed to achieve a desirable electrical contact.

Referring to FIG. 7, the magnetic tunnel junction material layer 302 may be formed on the surface of the bottom electrode material layer 301 (e.g., in S803 of FIG. 13).

In one embodiment, forming the magnetic tunnel junction material layer 302 may include sequentially depositing a fixed material layer 3021, a barrier material layer 3022, and a free material layer 3023 on the surface of the bottom electrode material layer 301 by a chemical vapor deposition process.

After forming the magnetic tunnel junction material layer 302, a top electrode material layer 303 may be formed on the surface of the magnetic tunnel junction material layer 302 (e.g., in S804 of FIG. 13).

The top electrode material layer 303 may be formed by a physical vapor deposition process or a chemical vapor deposition process.

The top electrode material layer 303 may be a single-layer structure or a multiple-layer structure, and the bottom electrode material layer 301 may be a single-layer structure or a multiple-layer structure.

In one embodiment, the top electrode material layer 303 may be a double-layer structure, including a first top electrode material layer 3031 on the surface of the magnetic tunnel junction material layer and a second top electrode material layer 3032 on the surface of the first top electrode material layer 3031. The bottom electrode material layer 301 may be a single-layer structure.

Referring to FIG. 7, a patterned photoresist layer 313 may be formed on the surface of the top electrode material layer 303. The patterned photoresist layer 313 may cover the top electrode material layer 303 above the first metal layer 211 at the memory cell region 201. The top electrode material layer 303, the magnetic tunnel junction material layer 302, and the bottom electrode material layer 301 may be etched sequentially along the patterned photoresist layer 313, thereby obtaining the bottom electrode layer, the magnetic tunnel junction layer, and the top electrode layer which are electrically connected to the first metal layer 211 at the memory cell region 201.

Figure 8:
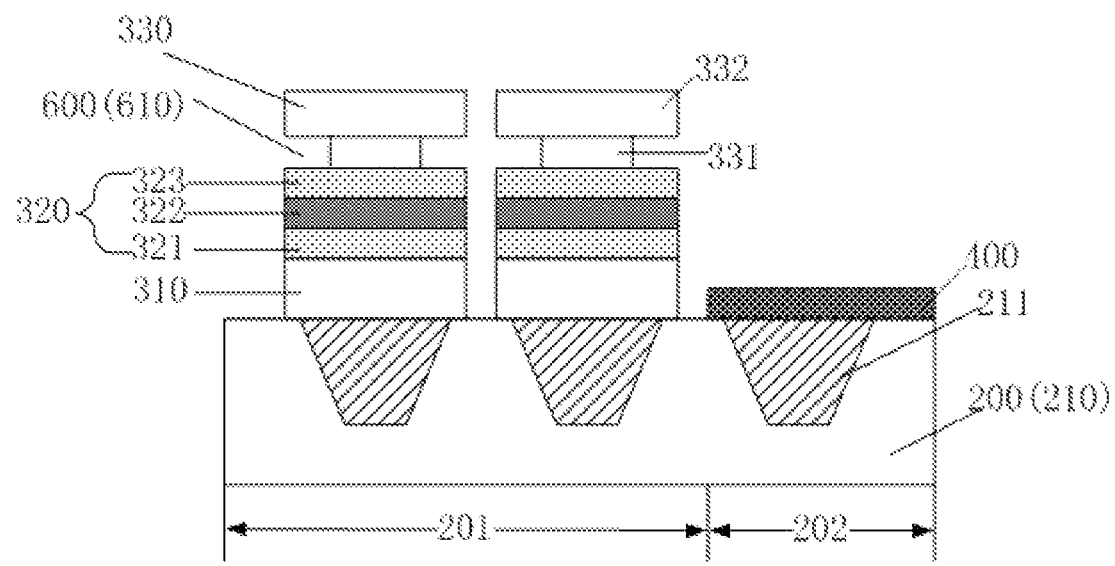
Figure 9:
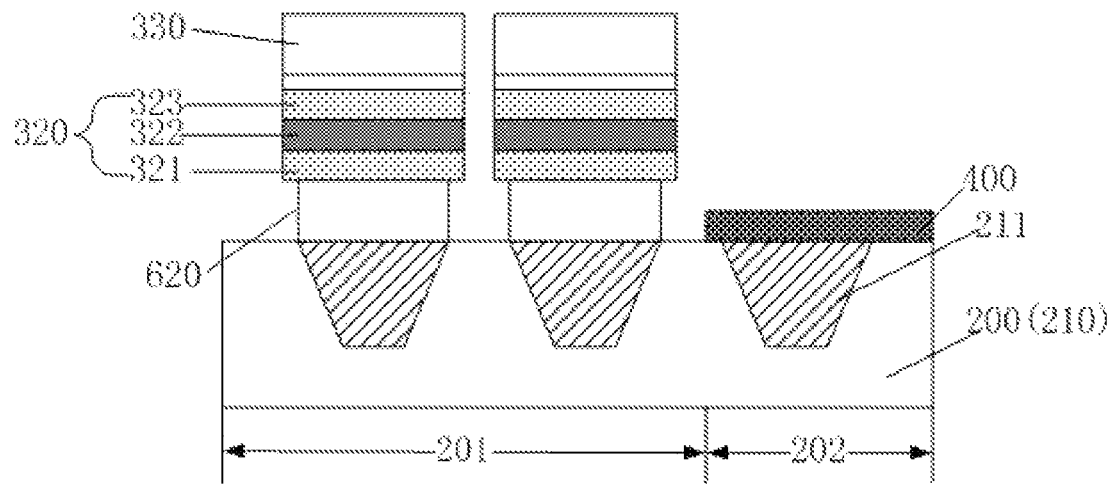

Referring to FIG. 8, using the patterned photoresist layer 313 as a mask, the top electrode material layer 303, the magnetic tunnel junction material layer 302, and the bottom electrode material layer 301 may be sequentially etched till the first dielectric layer 210 is exposed, thereby forming the top electrode layer 330, the magnetic tunnel junction layer 320, and the bottom electrode layer 310 (e.g., in S805 of FIG. 13).

In one embodiment, a portion of the first dielectric layer 210 between adjacent first metal layers 211 may also be etched.

In one embodiment, the top electrode material layer 303, the magnetic tunnel junction material layer 302, and the bottom electrode material layer 301 may be etched by a process including a dry etching process. In other embodiments, the top electrode material layer 303, the magnetic tunnel junction material layer 302, and the bottom electrode material layer 301 may also be etched by a process including a wet etching process, a dry etching process, or a combination thereof.

Referring to FIG. 8, in one embodiment, after the top electrode layer 330, the magnetic tunnel junction layer 320, and the bottom electrode layer 310 are formed, at least the sidewalls of one of the top electrode layer 330 and the bottom electrode layer 310 may be etched to form the openings 600; and the openings 600 may expose a portion of the surface of the magnetic tunnel junction layer 320 (e.g., in S806 of FIG. 13).

The openings 600 may include the first type openings or the second type openings. The first type openings may extend from the sidewalls of at least one of the top electrode layer and the bottom electrode layer to the middle along the direction in parallel with the surface of the substrate; and the second type openings may pass through at least one of the top electrode layer and the bottom electrode layer along the direction perpendicular to the surface of the substrate.

Referring to FIG. 8, in one embodiment, a portion of the sidewalls of the top electrode layer 330 may be etched to form the first type openings 610 in the sidewalls; the first type openings 610 may extend from the sidewalls on one side of the top electrode layer 330 to the middle along the direction parallel to the surface of the base substrate 200; and two symmetrically disposed first type openings 610 may not completely pass through the width portion of the top electrode layer 330 along direction in parallel to the surface of the base substrate 200.

In one embodiment, a portion of the sidewalls of the top electrode layer 330 may be etched to form the first type openings 610, such that the top electrode layer 330 may not be coplanar with the edges of the magnetic tunnel junction layer 320 along the direction perpendicular to the surface of the base substrate 200. When the semiconductor structure is in operation, the current may flow through the etched interface, that is, the current may flow through the surface of the magnetic tunnel junction layer 320 exposed by the first type openings 610 and the surface formed by the etching of the top electrode layer 330. In such way, the current flow path may be increased, and the resistance of the top electrode layer 330 may be increased, thereby reducing the leakage current. Therefore, the resistance value difference of the magnetic tunnel junction layer 320 under different operation states may be improved, which improves the performance of the semiconductor structure.

In one embodiment, the top electrode material layer 303 may be a double-layer structure, such that the formed top electrode layer 330 may be a double-layer structure. The top electrode layer 330 may include a first top electrode layer 331 on the surface of the magnetic tunnel junction layer 320 and a second top electrode material layer 332 on the surface of the first top electrode layer 331. In one embodiment, the sidewalls of the first top electrode layer 331 may be etched to form the openings. The height of the first type opening 610 formed along the direction perpendicular to the surface of the base substrate 200 may be equal to the thickness of the first top electrode layer 331.

In one embodiment, the sidewalls of the top electrode layer 330 may be etched by a wet etching process. In another embodiment, referring to FIG. 9, the sidewalls of the bottom electrode layer 310 may be etched along the direction perpendicular to the surface of the base substrate 200 to form the second type openings 620 passing through the bottom electrode layer 310. The height of the second type opening 620 along the direction perpendicular to the surface of the base substrate 200 may be equal to the thickness of the bottom electrode layer 310; and the sidewall on one side of the second type opening 620 may coincide with a new sidewall on one side of the bottom electrode layer 310 formed after the etching process.

The bottom electrode layer 310 and the top electrode layer 330 may be etched using a same etching process.

Figure 10:
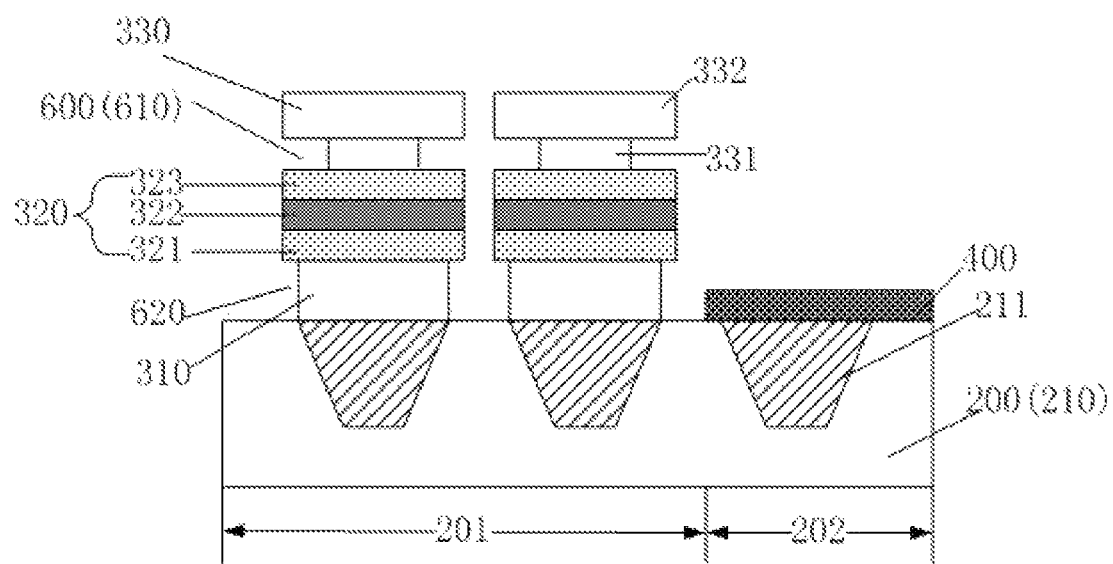

In another embodiment, referring to FIG. 10, the sidewalls of the top electrode layer 330 may be etched to form the first type openings 610, and the sidewalls of the bottom electrode layer 310 may be etched to form the second type openings 620.

In other embodiments, the sidewalls of the top electrode layer 330 may be etched to form the second type openings 620; or the sidewalls of the bottom electrode layer 310 may be etched to form the first type openings 610; or the sidewalls of the top electrode layer 330 may be etched to form the second type openings 620, and the sidewalls of the bottom electrode layer 310 may be etched to form the first type openings 610; or each of the top electrode layer 330 and the bottom electrode layer 310 may be etched to form the first type openings 610 or form the second type openings 620.

In another embodiment of the present disclosure, the sequence of steps for forming the openings 600 may be changed.

The sequence of steps may include etching the top electrode material layer till exposing the surface of the magnetic tunnel junction material layer to form the top electrode layer; etching the sidewalls of the top electrode layer to form the openings; etching the magnetic tunnel junction material layer till exposing the surface of the bottom electrode material layer to form the magnetic tunnel junction layer; and etching the bottom electrode material layer till exposing the surface of the substrate to form the bottom electrode layer.

The formed openings may still be the first type openings or the second type openings.

After the bottom electrode layer is formed, the sidewalls of the bottom electrode layer may be etched to form the first type openings or the second type openings; or the bottom electrode layer may not be etched, without forming the openings.

Figure 11:
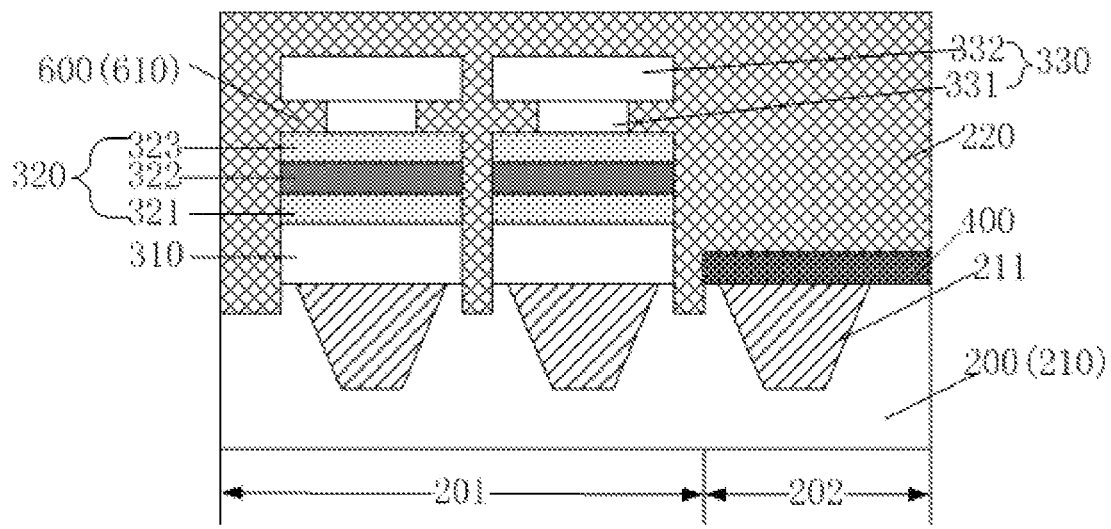

Referring FIG. 11, after the openings 600 are formed, the second dielectric layer 220 may be formed on the base substrate 200. The second dielectric layer 220 may cover the surface of the first dielectric layer 210, the sidewalls and surfaces of the top electrode layer 330, the magnetic tunnel junction layer 320, and the bottom electrode layer 310, and the surface of the etching stop layer 400.

In one embodiment, the second dielectric layer 220 may be formed by a chemical vapor deposition process.

Figure 12:
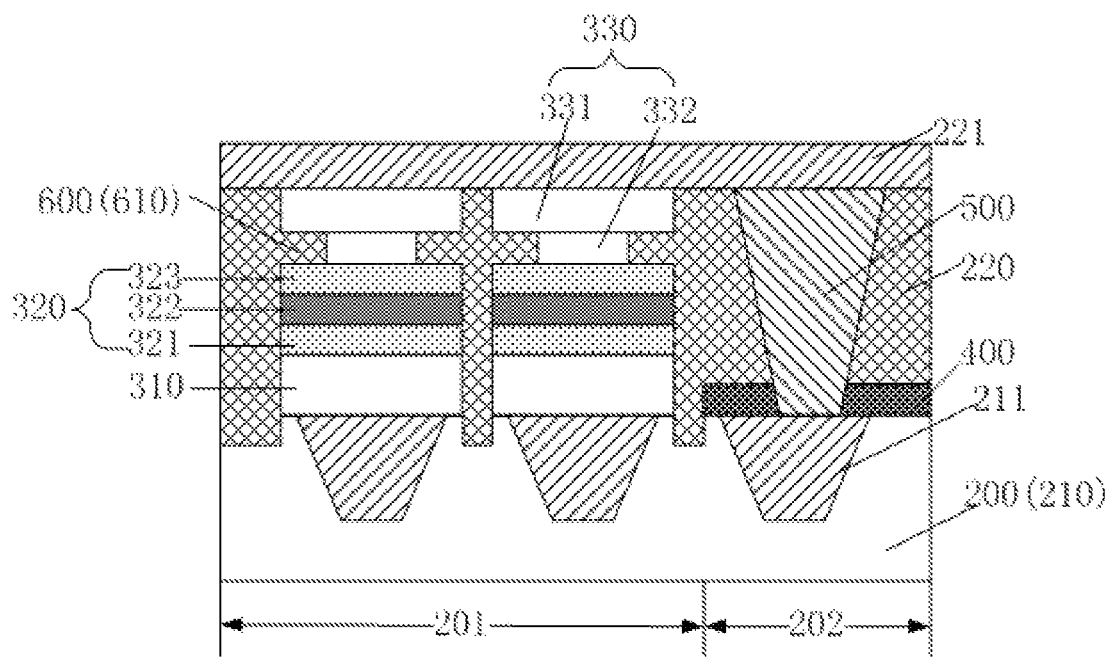

Referring to FIG. 12, after the second dielectric layer 220 is formed, the via hole 500 may be formed in the second dielectric layer 220.

In one embodiment, forming the via hole 500 may include etching a portion of the second dielectric layer 220 at the peripheral drive circuit region 202 to form a trench (not shown) in the second dielectric layer 220; and forming the via hole 500 by filling the trench with a metal material using an electrochemical plating process.

Referring to FIG. 12, the fabrication method may further include forming the second metal layer 221 on the surfaces of the top electrode layer 330, the second dielectric layer 220, and the via hole 500.

In one embodiment, the second metal layer 221 may be in direct electrical contact with the top electrode layer 330; and the second metal layer 221 may be electrically connected to the first metal layer 211 at the peripheral drive circuit region 202 through the via hole 500.

In one embodiment, the second metal layer 221 may be directly formed on the top electrode layer 330, without forming a conductive plug connecting the top electrode layer 330 and the second metal layer 221 using an additional process, which may simplify the process flow and may be compatible with existing logic processes.

Although the present disclosure has been disclosed above, the present disclosure may not be limited thereto. Any changes and modifications may be made by those skilled in the art without departing from the spirit and scope of the disclosure, and the scope of the disclosure should be determined by the scope defined by the appended claims.

What is claimed is:

1. A semiconductor structure, comprising:
   a base substrate;
   a bottom electrode layer on the base substrate;
   a magnetic tunnel junction layer on the bottom electrode layer; and
   a top electrode layer on the magnetic tunnel junction layer, wherein openings are formed at least exposing a portion of an upper surface of the magnetic tunnel junction layer or a portion of a lower surface of the magnetic tunnel junction layer;
   wherein:
   the top electrode layer includes a first top electrode portion and a second top electrode portion, the second top electrode portion being located between the first top electrode portion and the magnetic tunnel junction layer, a maximum length of the first top electrode portion in a horizontal direction parallel to a top surface of the base substrate being same as a maximum length of the magnetic tunnel junction layer in the horizontal direction, and a maximum length of the second top electrode portion in the horizontal direction being smaller than the maximum length of the magnetic tunnel junction layer in the horizontal direction;
   the openings include a first type opening or a second type opening;
   the first type opening extends from a sidewall of the top electrode layer or a sidewall of the bottom electrode layer to a middle of the top electrode layer or a middle of the bottom electrode layer along a direction in parallel with the top surface of the base substrate;
   the second type opening passes through the top electrode layer or the bottom electrode layer along a direction perpendicular to the top surface of the base substrate; and
   the openings expose the portion of the upper surface of the magnetic tunnel junction layer and the portion of the lower surface of the magnetic tunnel junction layer.

2. The structure according to claim 1, wherein:
the bottom electrode layer is a single-layer or a multiple-layer structure.

3. The structure according to claim 1, wherein:
the magnetic tunnel junction layer includes a fixed layer on the bottom electrode layer, a barrier layer on the fixed layer, and a free layer on the barrier layer.

4. The structure according to claim 3, wherein:
the fixed layer is made of a material including Co, Fe, Ru, B, Pt, Ta, Ni, Ta, Cr, an alloy material including at least one of Co, Fe, Ru, B, Pt, Ta, Ni, Ta, and Cr, or a combination thereof;
the barrier layer is made of a material including $Al_2O_3$, MgO, or a combination thereof; and the free layer is made of a material including Co, Fe, Ru, B, an alloy material including at least one of Co, Fe, Ru, and B, or a combination thereof.

5. The structure according to claim 4, wherein:
the magnetic tunnel junction layer further includes a protective layer on the free layer;
and the protective layer is made of a material including magnesium oxide, aluminum oxide, or a combination thereof.

6. The structure according to claim 1, further including:
a first metal layer in the base substrate, wherein a top surface of the first metal layer is coplanar with the top surface of the base substrate.

7. A method for fabricating a semiconductor structure, comprising:
providing a substrate;
forming a bottom electrode material layer on the substrate;
forming a magnetic tunnel junction material layer on the bottom electrode material layer;

forming a top electrode material layer on the magnetic tunnel junction material layer;

sequentially etching the top electrode material layer, the magnetic tunnel junction material layer, and the bottom electrode material layer till a surface of the substrate is exposed, thereby forming a top electrode layer, a magnetic tunnel junction layer, and a bottom electrode layer; and at least etching sidewalls of the top electrode layer or sidewalls of the bottom electrode layer to form openings, wherein the openings expose a portion of a surface of the magnetic tunnel junction layer;

wherein:

the top electrode layer includes a first top electrode portion and a second top electrode portion, the second top electrode portion being located between the first top electrode portion and the magnetic tunnel junction layer, a maximum length of the first top electrode portion in a horizontal direction parallel to a top surface of the base substrate being same as a maximum length of the magnetic tunnel junction layer in the horizontal direction, and a maximum length of the second top electrode portion in the horizontal direction being smaller than the maximum length of the magnetic tunnel junction layer in the horizontal direction;

the openings include a first type opening or a second type opening;

the first type opening extends from a sidewall of the top electrode layer or a sidewall of the bottom electrode layer to a middle of the top electrode layer or a middle of the bottom electrode layer along a direction in parallel with the top surface of the base substrate;

the second type opening passes through the top electrode layer or the bottom electrode layer along a direction perpendicular to the top surface of the base substrate; and the openings expose the portion of the upper surface of the magnetic tunnel junction layer and the portion of the lower surface of the magnetic tunnel junction layer.

8. The method according to claim 7, further including:
after forming the top electrode layer, the magnetic tunnel junction layer, and the bottom electrode layer, etching the sidewalls of the top electrode layer to form the openings.

9. The method according to claim 7, further including:
after forming the top electrode layer, the magnetic tunnel junction layer, and the bottom electrode layer, etching the sidewalls of the bottom electrode layer to form the openings.

10. The method according to claim 7, further including:
after forming the top electrode layer, the magnetic tunnel junction layer, and the bottom electrode layer, etching the sidewalls of the top electrode layer and the sidewalls of the bottom electrode layer to form the openings.

11. The method according to claim 7, further including:
etching the top electrode material layer till exposing a surface of the magnetic tunnel junction material layer to form the top electrode layer;
etching the sidewalls of the top electrode layer to form the openings;
etching the magnetic tunnel junction material layer till exposing a surface of the bottom electrode material layer to form the magnetic tunnel junction layer; and
etching the bottom electrode material layer till exposing the surface of the substrate to form the bottom electrode layer.

12. The method according to claim 11, further including:
after forming the bottom electrode layer, etching the sidewalls of the bottom electrode layer to form the openings.

13. The method according to claim 7, wherein:
the sidewalls of the top electrode layer or the sidewalls of the bottom electrode layer are etched by a process including a wet etching process, a dry etching process, or a combination thereof.

14. The method according to claim 7, further including:
before forming the bottom electrode material layer, forming a plurality of discrete first metal layers in the substrate, wherein a top surface of the plurality of first metal layers is coplanar with a top surface of the substrate.

* * * * *